(12) United States Patent
Li et al.

(10) Patent No.: US 10,511,280 B2
(45) Date of Patent: Dec. 17, 2019

(54) RESONATOR AND RESONATOR ARRAY

(71) Applicant: NATIONAL TSING HUA UNIVERSITY, Hsinchu (TW)

(72) Inventors: Sheng-Shian Li, Taoyuan (TW); Gayathri Pillai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 15/987,923

(22) Filed: May 24, 2018

(65) Prior Publication Data

US 2019/0229701 A1    Jul. 25, 2019

(30) Foreign Application Priority Data

Jan. 19, 2018   (TW) .............................. 107102098 A

(51) Int. Cl.
*H03H 9/02* (2006.01)
*H03H 9/13* (2006.01)
*H03H 9/24* (2006.01)

(52) U.S. Cl.
CPC .... *H03H 9/02433* (2013.01); *H03H 9/02015* (2013.01); *H03H 9/02259* (2013.01); *H03H 9/02338* (2013.01); *H03H 9/131* (2013.01); *H03H 9/2436* (2013.01); *H03H 2009/0244* (2013.01)

(58) Field of Classification Search
CPC .......... H03H 9/02433; H03H 9/02015; H03H 9/02259; H03H 9/02338; H03H 9/131; H03H 9/02062; H03H 9/2436; H03H 9/485; H03H 9/505; H03H 9/525; H03H 2009/0244; H03H 2009/02385; H03H 2009/02503; H03H 2009/241; H03H 2009/2442
USPC ........................................ 333/186, 187, 189
See application file for complete search history.

(56) References Cited

U.S. PATENT DOCUMENTS

| | | | |
|---|---|---|---|
| 6,909,221 B2 * | 6/2005 | Ayazi ....................... | H03H 3/02 310/312 |
| 8,450,913 B1 | 5/2013 | Ayazi et al. | |
| 8,786,166 B2 * | 7/2014 | Jaakkola .............. | H03H 3/0072 310/311 |

FOREIGN PATENT DOCUMENTS

CN            104202010 A       12/2014

* cited by examiner

*Primary Examiner* — Barbara Summons
(74) *Attorney, Agent, or Firm* — CKC & Partners Co., LLC

(57) ABSTRACT

The present disclosure provides a resonator which resonates in a bulk acoustic wave mode. The resonator includes a resonator body, at least one transducer arm and a substrate. The resonator body is deformed at least along a first direction. The transducer arm is connected to the resonator body along the first direction and includes a base, a piezoelectric layer and an electrode layer. The base includes a first end connected to the resonator body. The piezoelectric layer is disposed above the base but not extended to the resonator body, and the electrode layer is disposed above the piezoelectric layer but not extended to the resonator body. The substrate is for securing the transducer arm such that the resonator body is suspended.

11 Claims, 19 Drawing Sheets

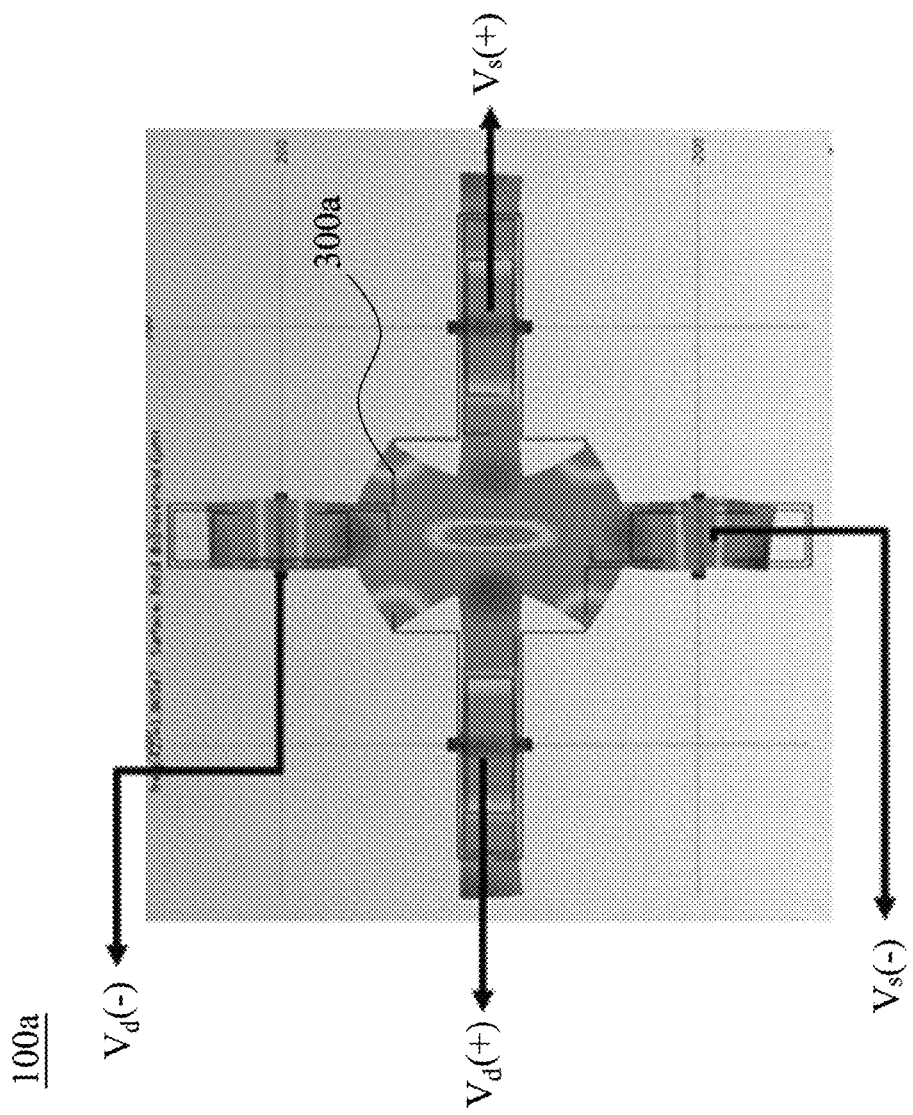

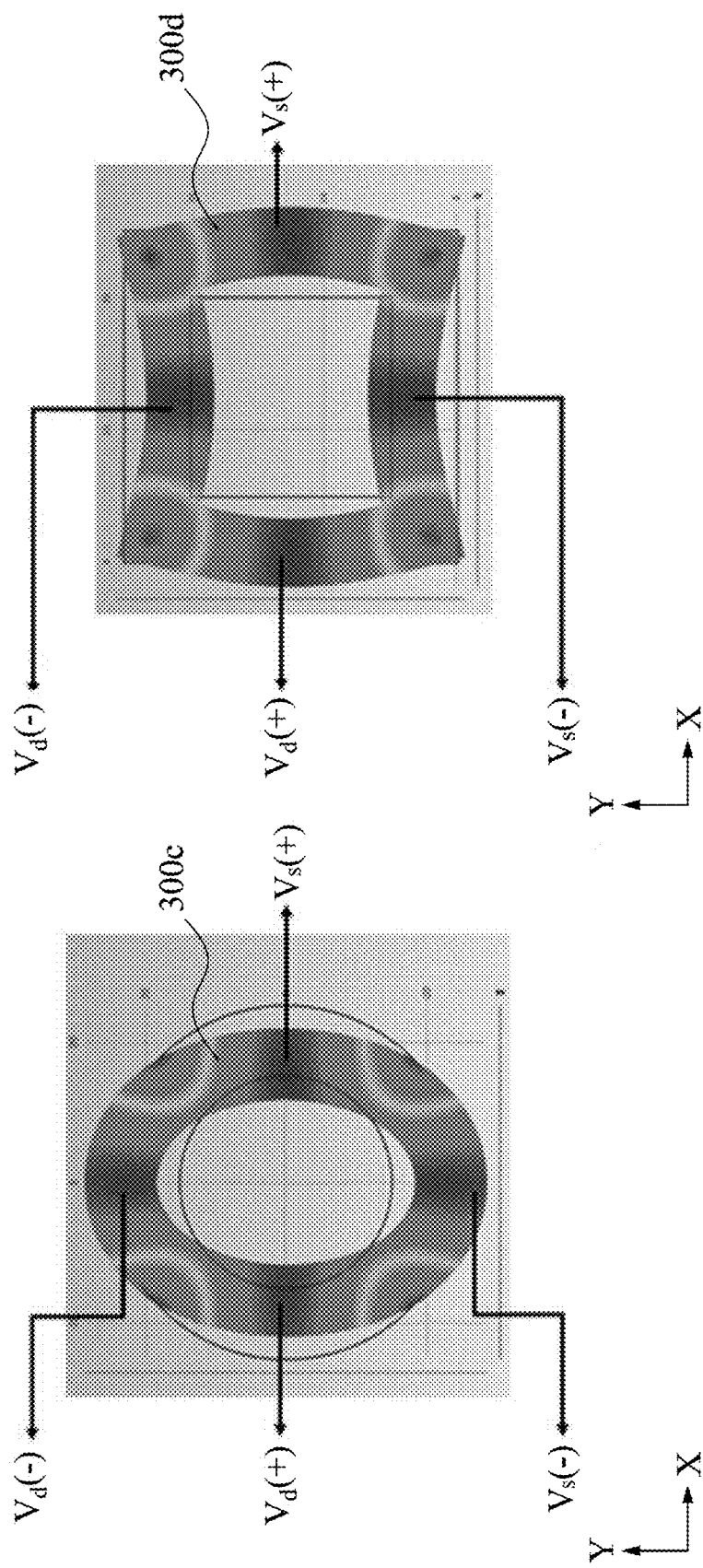

RESONATOR AND RESONATOR ARRAY

RELATED APPLICATIONS

This application claims priority to Taiwan Application Serial Number 107102098, filed Jan. 19, 2018, which is herein incorporated by reference.

BACKGROUND

Technical Field

The present disclosure relates to a resonator and a resonator array. More particularly, the present disclosure relates to a microelectromechanical system (MEMS) resonator and a resonator array.

Description of Related Art

A resonator, an electric element which resonates at a resonant frequency, is widely used in electronic products. Owing to the miniaturization and high quality demands of the electronic products, there is a need to develop a resonator with high quality factor (Q).

Piezoelectric MEMS resonators are resonators with high performance which are manufactured by using the MEMS technique. The piezoelectric resonators can be configured for signal filtering by translating electric signals to mechanical vibrations via piezoelectric layers and outputting electric signals again. Such piezoelectric MEMS resonators have high reliabilities and can be used in packages with different sizes, as a result, the piezoelectric MEMS resonators are popular.

A conventional MEMS resonator includes a resonator body and two arms disposed at two sides of the resonator body. One end of the arm is secured on the substrate to allow the resonator body being suspended, and electrodes and piezoelectric layers are disposed at both the resonator body and the arms. The MEMS resonators with such structure have lots of energy loss, such as an anchor loss and a thermoelastic damping; as a result, the quality factor cannot be increased.

Therefore, how to improve the structure of MEMS resonators to increase the quality factor becomes a pursuit target for practitioners.

SUMMARY

A resonator which resonates in a bulk acoustic wave mode is provided. The resonator includes a resonator body, at least one transducer arm and a substrate. The resonator body is deformed at least along a first direction. The transducer arm is connected to the resonator body along the first direction and includes a base, a piezoelectric layer and an electrode layer. The base includes a first end connected to the resonator body. The piezoelectric layer is disposed above the base but not extended to the resonator body, and the electrode layer is disposed above the piezoelectric layer but not extended to the resonator body. The substrate is for securing the transducer arm such that the resonator body is suspended.

A resonator array which resonates in a bulk acoustic wave mode is provided. The resonator array includes at least two resonator bodies, at least one connecting arm, at least one transducer arm and a substrate. The resonator bodies are deformed at least along a first direction. The connecting arm is connected between the two resonator bodies along the first direction. The transducer arm is connected to one of the resonator bodies along the first direction and is opposite to the connecting arm. The transducer arm includes a base, a piezoelectric layer and an electrode layer. The base includes a first end connected to one of the resonator bodies. The piezoelectric layer is disposed above the base but not extended to one of the resonator bodies, and the electrode layer is disposed above the piezoelectric layer but not extended to one of the resonator bodies. The substrate is for securing the transducer arm such that the two resonator bodies are suspended.

BRIEF DESCRIPTION OF THE DRAWINGS

The disclosure can be more fully understood by reading the following detailed description of the embodiments, with reference made to the accompanying drawings as follows:

FIG. 7 shows a deforming result of a resonator according to a 2nd embodiment of the present disclosure.

FIG. 11 shows a deforming result of a resonator body of a resonator according to a 4th embodiment of the present disclosure.

FIG. 12 shows a deforming result of a resonator body of a resonator according to a 5th embodiment of the present disclosure.

DETAILED DESCRIPTION

It will be understood that when an element (or mechanism or module) is referred to as being "disposed on/at", "connected to" or "coupled to" another element, it can be directly disposed on/at, connected or coupled to the other element, or it can be indirectly disposed on/at, connected or coupled to the other element; that is, intervening elements may be present. In contrast, when an element is referred to as being "directly disposed on/at," "directly connected to" or "directly coupled to" another element, there are no intervening elements present.

In addition, the terms first, second, third, etc. are used herein to describe various elements or components, these elements or components should not be limited by these terms. Consequently, a first element or component discussed below could be termed a second element or component.

Figure 1:
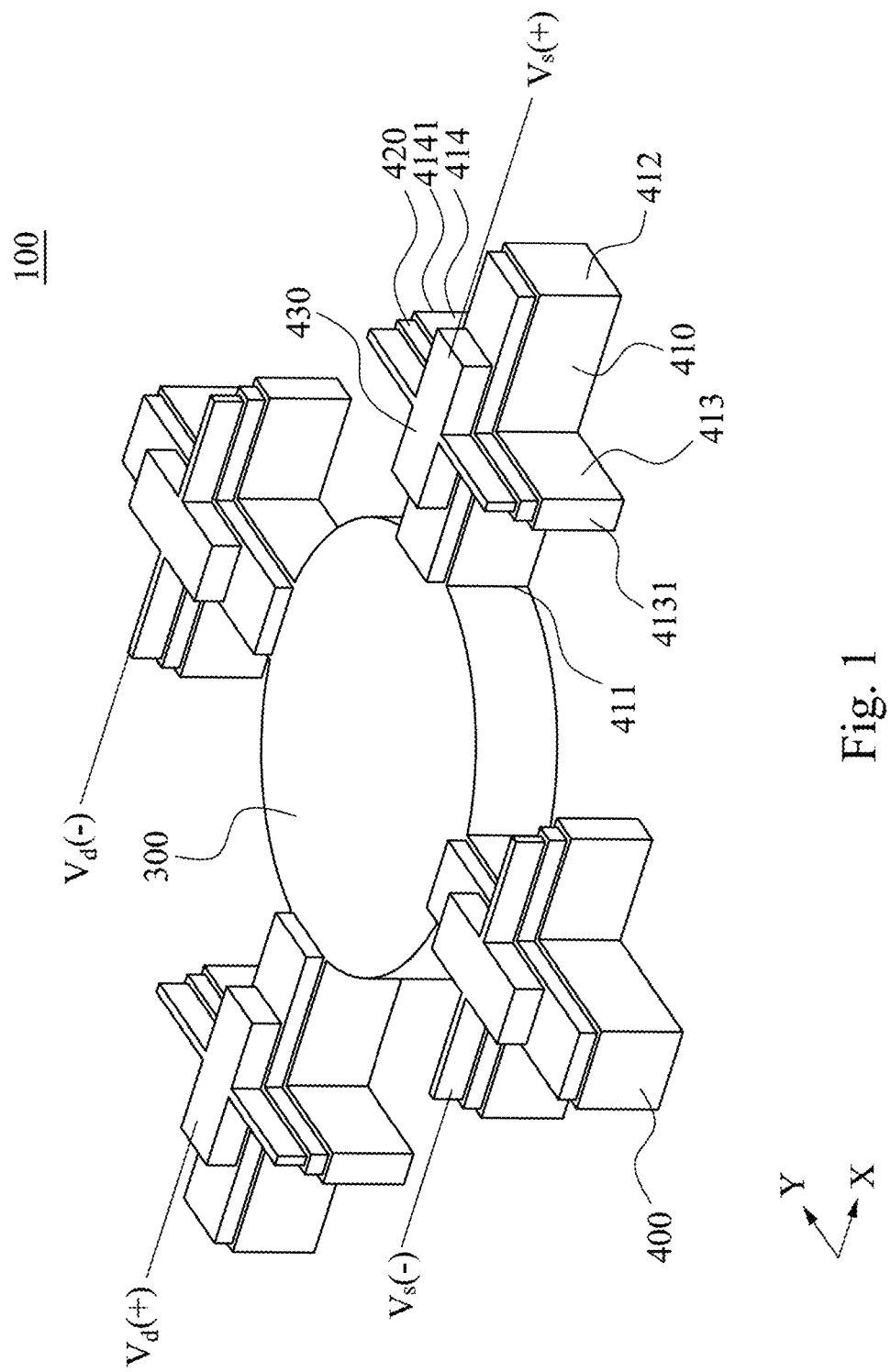
FIG. 1 shows a schematic view of a resonator according to a 1st embodiment of the present disclosure.
Figure 2:
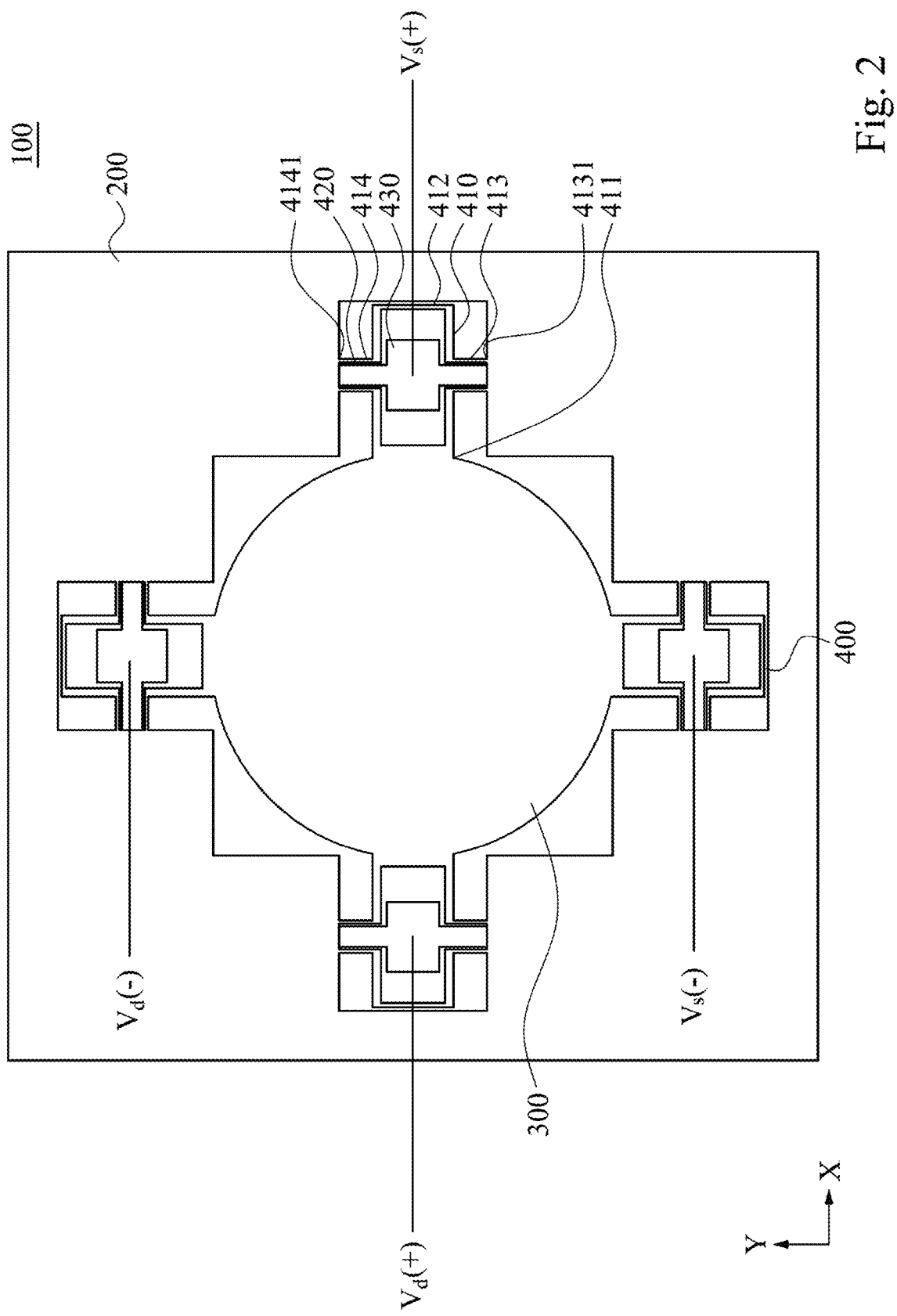
FIG. 2 shows a top view of the resonator of FIG. 1.
Figures 3A, 3B:
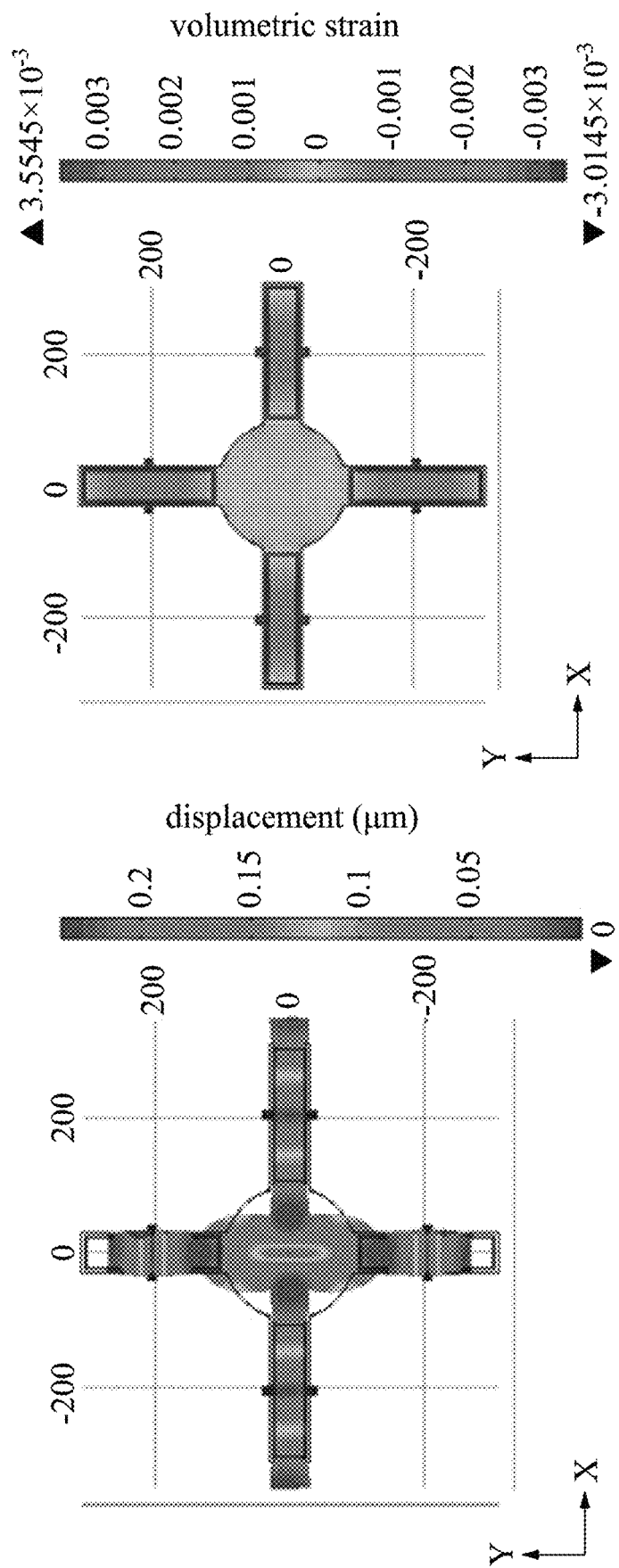
FIG. 3A shows one deforming result of the resonator of FIG. 1.
FIG. 3B shows a volumetric strain of the resonator of FIG. 3A.
Figures 4A, 4B:
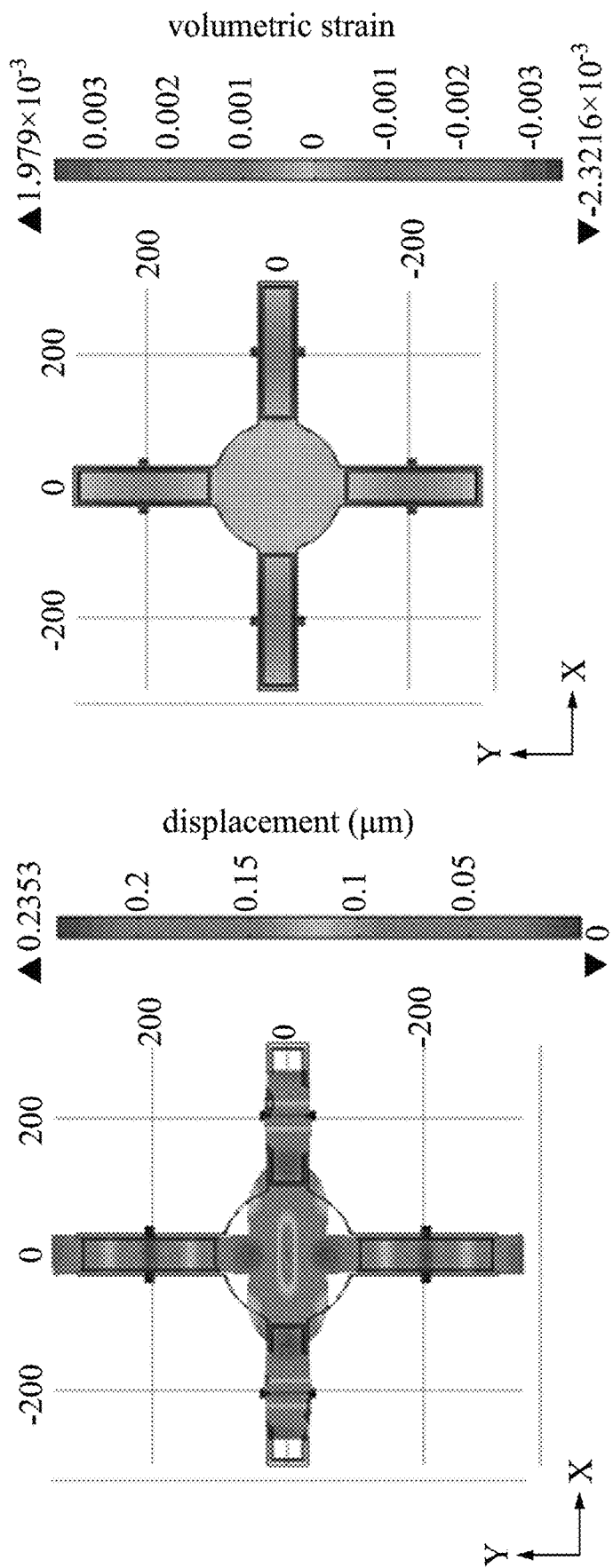
FIG. 4A shows another deformation result of the resonator of FIG. 1.
FIG. 4B shows a volumetric strain of the resonator of FIG. 4A.

FIG. 1 shows a schematic view of a resonator 100 according to a 1st embodiment of the present disclosure, in which a substrate 200 is omitted. FIG. 2 shows a top view of the resonator 100 of FIG. 1. FIG. 3A shows one deforming result of the resonator 100 of FIG. 1. FIG. 3B shows a volumetric strain of the resonator 100 of FIG. 3A. FIG. 4A shows another deforming result of the resonator 100 of FIG. 1. FIG. 4B shows a volumetric strain of the resonator 100 of FIG. 4A. Refer to FIGS. 1 to 4B, the resonator 100 which resonates in a bulk acoustic mode includes a resonator body 300, at least one transducer arm 400 and a substrate 200.

The resonator body 300 is deformed at least along a first direction X. The transducer arm 400 is connected to the resonator body 300 along the first direction X and includes a base 410, a piezoelectric layer 420 and an electrode layer 430. The base 410 includes a first end 411 connected to the resonator body 300. The piezoelectric layer 420 is disposed above the base 410 but not extended to the resonator body 300, and the electrode layer 430 is disposed above the piezoelectric layer 420 but not extended to the resonator body 300. The substrate 200 is for securing the transducer arm 400 such that the resonator body 300 is suspended.

Therefore, because the piezoelectric layer 420 and the electrode layer 430 are only disposed at the transducer arm 400 but not extended to the resonator body 300, the quality factor of the resonator 100 can be increased. The resonator 100 will be described in detail in the following paragraphs.

The resonator 100 is a MEMS resonator, and the substrate 200, the resonator body 300 and the base 410 are made of single crystal silicon. In addition to the first direction X, the resonator 100 of the 1st embodiment can be deformed along a second direction Y which is perpendicular to the first direction X. A number of the transducer arm 400 is four. Two of the transducer arms 400 are connected to the resonator body 300 along the first direction X, and the other two of the transducer arms 400 are connected to the resonator body 300 along the second direction Y.

Precisely, the resonator body 300 is disc-shaped, and the first direction X and the second direction Y are two radial direction of the disc, which are perpendicular to each other. The bases 410 of the two transducer arms 400 are connected to the resonator body 300 along the first direction X, respectively, and are opposite to each other. The bases 410 of the other two transducer arms 400 are connected to the resonator body 300 along the second direction Y, respectively, and are opposite to each other.

Each of the transducer arms 400 can further include two anchor portions 413, 414 protruded from two sides of the base 410, respectively, and each of the anchor portions 413, 414 has a distal end 4131, 4141 secured at the substrate 200. In other words, each of the anchor portions 413, 414 is perpendicular to the base 410, and includes a proximate end (not labeled) and the distal end 4131, 4141. The proximate end indicates the end which is connected to the base 410 and the distal end 4131, 4141 indicates the end which is connected to the substrate 200. Through the configuration of the anchor portions 413, 414, the base 410 can be suspended on the substrate 200, and a second end 412 of the base 410 does not need to be connected to the substrate 200. Additionally, the piezoelectric layer 420 and the electrode layer 430 are also disposed on each of the anchor portions 413, 414, and the electrode layers 430 on the anchor portion 414 can be extended to an electric source (not shown) to receive a power.

Please be noted that although the number of the transducer arms 400 illustrated in the drawings is four, the resonator 100 can include only one transducer arm 400 in other embodiment, and the configuration of four or two transducer arms 400 is for symmetry. Similarly, the number of the anchor portion can be one, and the configuration of two anchor portions is for symmetry.

During the manufacturing process, the resonator body 300, the base 410 and the anchor portions 413, 414 are formed by etching the substrate 200. The piezoelectric layer 420 is directly disposed at the base 410 and the anchor portions 413, 414, and the electrode layer 430 is directly disposed at the piezoelectric layer 420. The piezoelectric layer 420 can be made of aluminum nitride (AlN) and the electrode layer 430 can be made of aluminum. A length of the piezoelectric layer 420 can be equal to or less than a length of the base 410. In other embodiment (not shown), the piezoelectric layer 420 can be made of other piezoelectric materials, or the electrode layer 430 can be made of other metal materials with electric conductivity, or the length of the piezoelectric layer 420 can be shorter than the length of the base 410. The disclosure is not limited thereto.

As shown in FIG. 1, the resonator body 300 is disc-shaped. A first driving signal $V_d(+)$ and a second driving signal $V_d(-)$ are given to two of the electrode layers 430, respectively, and a first sensing signal $V_s(+)$ and a second sensing signal $V_s(-)$ are output from the other two of the electrode layers 430. Precisely, the first driving signal $V_d(+)$ is given to the electrode layer 430 located in an upper side of FIG. 2, and the second driving signal $V_d(-)$ is given to the electrode layer 430 located in a left side of FIG. 2. The first sensing signal $V_s(+)$ is output form the electrode layer 430 located in a lower side of FIG. 2, and the second sensing signal $V_s(-)$ is output form the electrode layer 430 located in a right side of FIG. 2. The base 410 can be configured for electrically connected to a power ground, and the first driving signal $V_d(+)$, the second driving signal $V_d(-)$, the first sensing signal $V_s(+)$ and the second sensing signal $V_s(-)$ are small signals. A phase difference between the first driving signal $V_d(+)$ and the second driving signal $V_d(-)$ is 180 degrees, such that an excitation configuration of the resonator 100 is fully differential driving/sensing, and the resonator 100 can resonate in a wine glass mode.

As show in FIGS. 3A and 3B, a center point of the resonator body 300 and a central point of a virtual line connected between two anchor portions 413, 414, which is equal to a central point of the base 410 along the first direction X, can be deemed as nodal points where a displacement amplitude is zero when the resonator 100 is excited to resonate and deform along the first direction X and the second direction Y. The volumetric strains of the transducer arms 400 disposed along the first direction X are opposite, and the volumetric strains of the transducer arms 400 disposed along the second direction Y are opposite. As shown in FIGS. 4A and 4B, the resonator 100 is excited to resonate and deform along the first direction X and the second direction Y. The volumetric strains of the transducer arms 400 disposed along the first direction X are opposite, and the volumetric strains of the transducer arms 400 disposed along the second direction Y are opposite.

Figure 5:
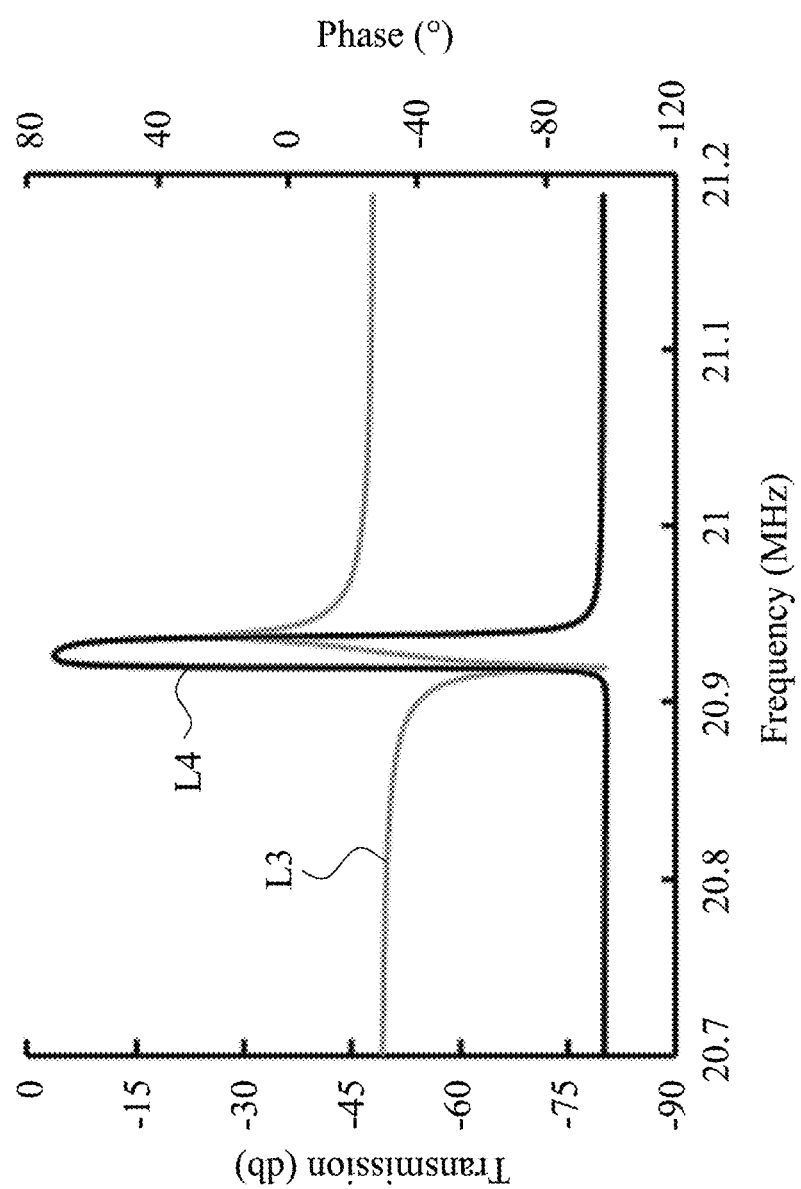
FIG. 5 shows a measuring result of $S_{dd21}$ of the resonator via network vector analyzer.

FIG. 5 shows a measuring result of $S_{dd21}$ of the resonator 100 via network vector analyzer Agilent E5071C. Refer to FIG. 5, the curve L3 shows a relationship between frequency and transmission, and the curve L4 shows a relationship between frequency and phase. A resonant frequency of the resonator 100 of the 1st embodiment in the air with 0 dBm driving power is 20.936 MHz (about 21 MHz). An intersection loss is 25.6 dB, and a quality factor is 8,045. Moreover, a figure of merit is 169e+09, which are better than conventional piezoelectric resonators.

Figure 6:
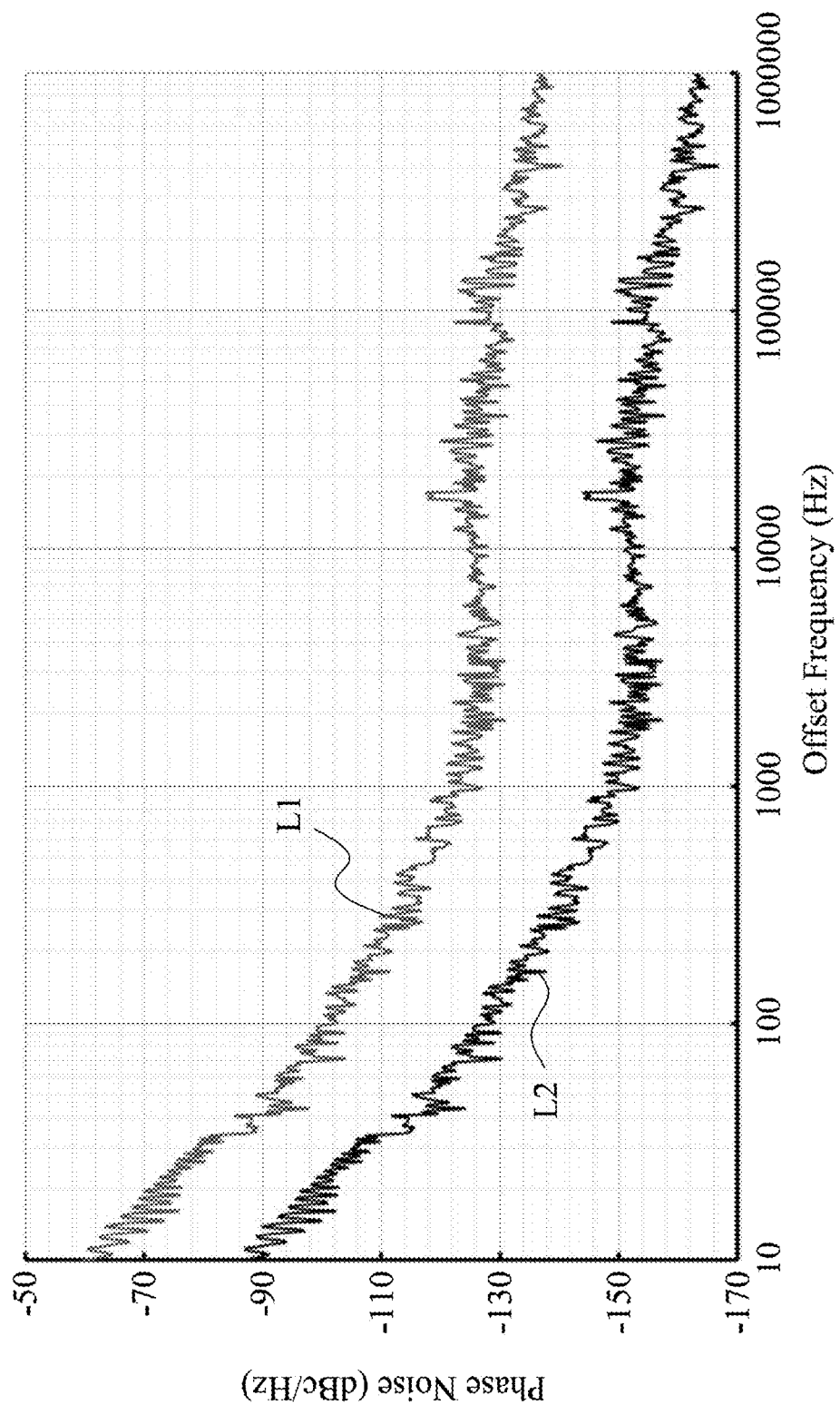
FIG. 6 shows a measuring result of phase noise of the resonator of FIG. 1.

FIG. 6 shows a measuring result of phase noise of the resonator 100 of FIG. 1. A HF2LI lock-in amplifier, a phase-locked loop and a signal analyzer are used to analyze the resonator 100 in an uncontrollable environment. A filter bandwidth of the phase-locked loop is set to 100 kHz to show the noise shaping by the resonator 100 at a frequency of 100 kHz. The curve L1 shows a measuring result of the resonator 100 at the resonant frequency of 20.926 KHz, and the curve L2 shows a measuring result of the resonator 100 down converted to 1 MHz. It can be known from the curve L1 and the curve L2 that the close-to-carrier phase noise can be improved owing to the high quality factor of the resonator 100. In addition, the phase noise is −106 dBc/Hz at 100 Hz and −125 dBc/Hz at 1 kHz.

Please be noted that the resonator 100 can be driven by other method to resonate in other mode. The transducer arm 400 can further include a ground layer. The ground layer can be disposed at one side of the base 410, which is far away from the piezoelectric layer 420, or the ground layer can be disposed between the base 410 and the piezoelectric layer 420. When the transducer arm 400 includes the ground layer, not the base 410 but the ground layer is electrically connected to the power ground.

Figure 8B:
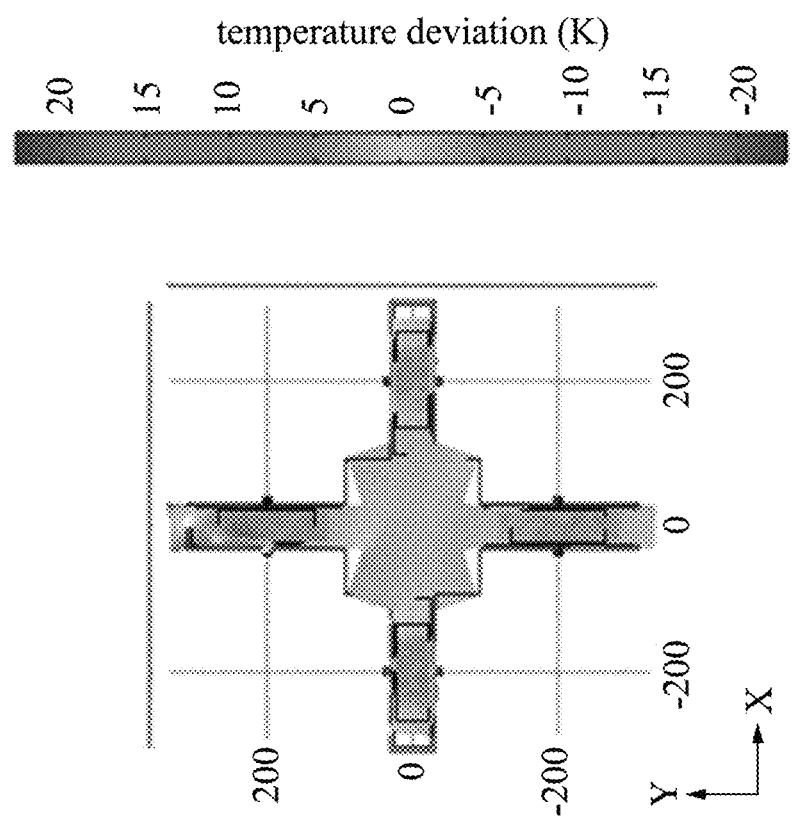
FIG. 8B shows another temperature deviation of the resonator of FIG. 7.
Figure 8A:
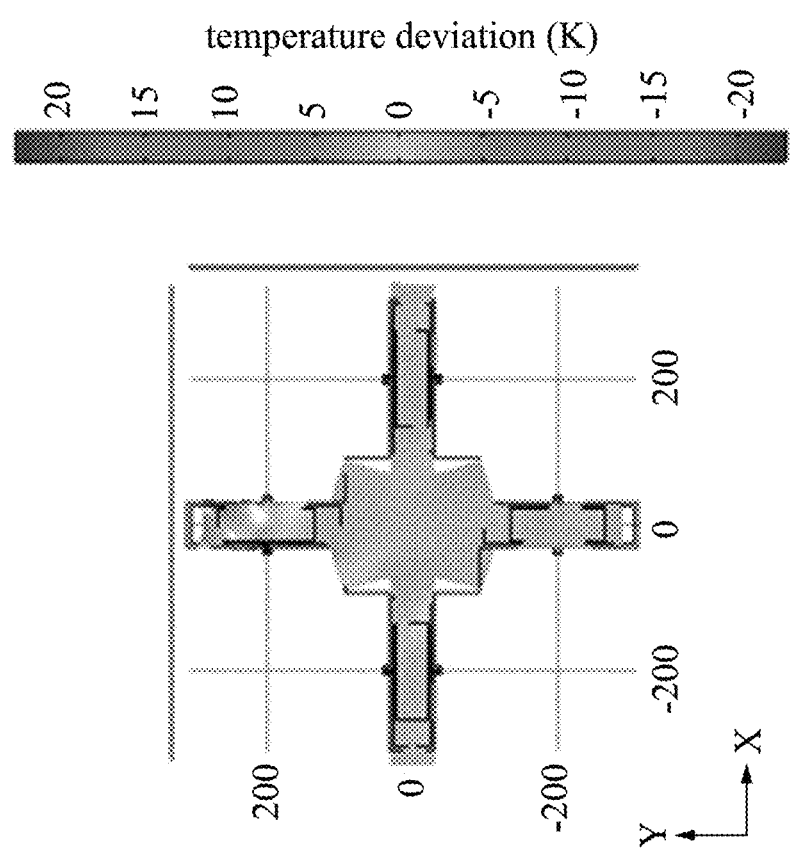
FIG. 8A shows one temperature deviation of the resonator of FIG. 7.

FIG. 7 shows a deforming result of a resonator 100a according to a 2nd embodiment of the present disclosure. FIG. 8A shows one temperature deviation of the resonator 100a of FIG. 7. FIG. 8B shows another temperature deviation of the resonator 100a of FIG. 7. Please refer to FIGS. 7, 8A and 8B, the structure of the resonator 100a is similar to the resonator 100 of the 1st embodiment of FIG. 1, but the resonator body 300a of the resonator 100a is board-shaped. Precisely, the resonator body 300a is square and can resonate in Lame mode when exciting. As shown in FIGS. 8A and 8B, the thermoelastic damping is almost zero when the resonator 100a resonates.

Figure 9:
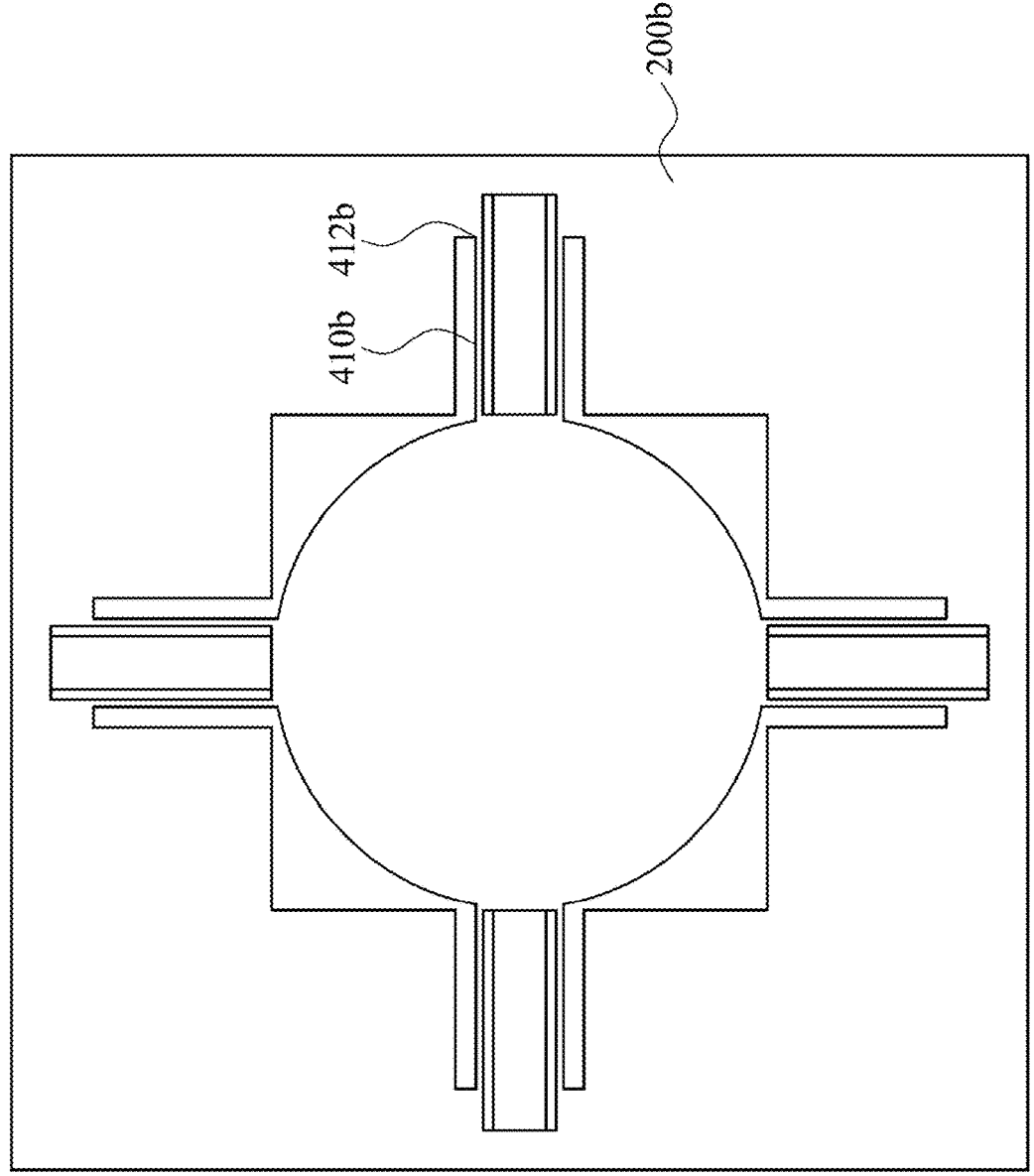
FIG. 9 shows a top view of a resonator according to a 3rd embodiment of the present disclosure.
Figure 10B:
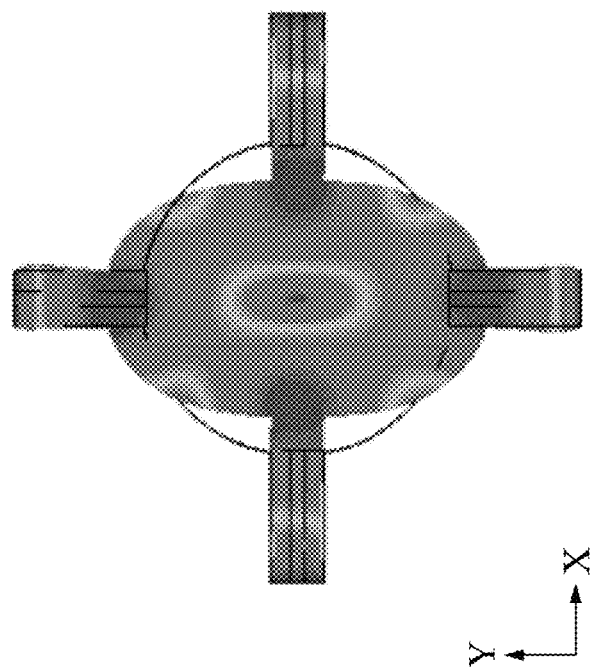
FIG. 10B shows another deforming result of the resonator of FIG. 9.
Figure 10A:
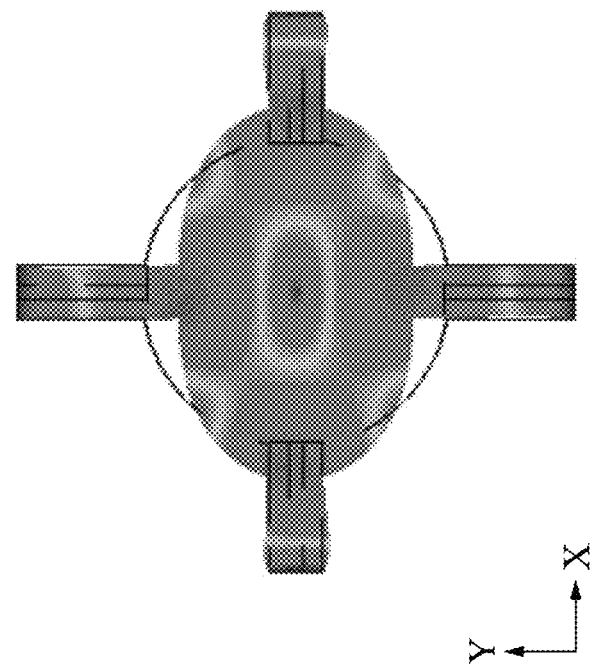
FIG. 10A shows one deforming result of the resonator of FIG. 9.

FIG. 9 shows a top view of a resonator 100b according to a 3rd embodiment of the present disclosure. FIG. 10A shows one deforming result of the resonator 100b of FIG. 9. FIG. 10B shows another deforming result of the resonator 100b of FIG. 9. Please refer to FIGS. 9, 10A and 10B, the structure of the resonator 100b is similar to the resonator 100 of the 1st embodiment of FIG. 1, but the transducer arm does not include any anchor portion. On the other hand, the base 410b includes a second end 412b opposite to a first end, and the second end 412b is secured at the substrate 200b.

FIG. 11 shows a deforming result of a resonator body 300c of a resonator according to a 4th embodiment of the present disclosure. Please refer to FIG. 11, the structure of the resonator is similar to the structure of the resonator 100 of the 1st embodiment of FIG. 1, but the resonator body 300c is a hollow disc.

FIG. 12 shows a deforming result of a resonator body 300d of a resonator according to a 5th embodiment of the present disclosure. Please refer to FIG. 12, the structure of the resonator is similar to the structure of the resonator 100 of the 1st embodiment of FIG. 1, but the resonator body 300d is a hollow board.

Figures 13, 14:
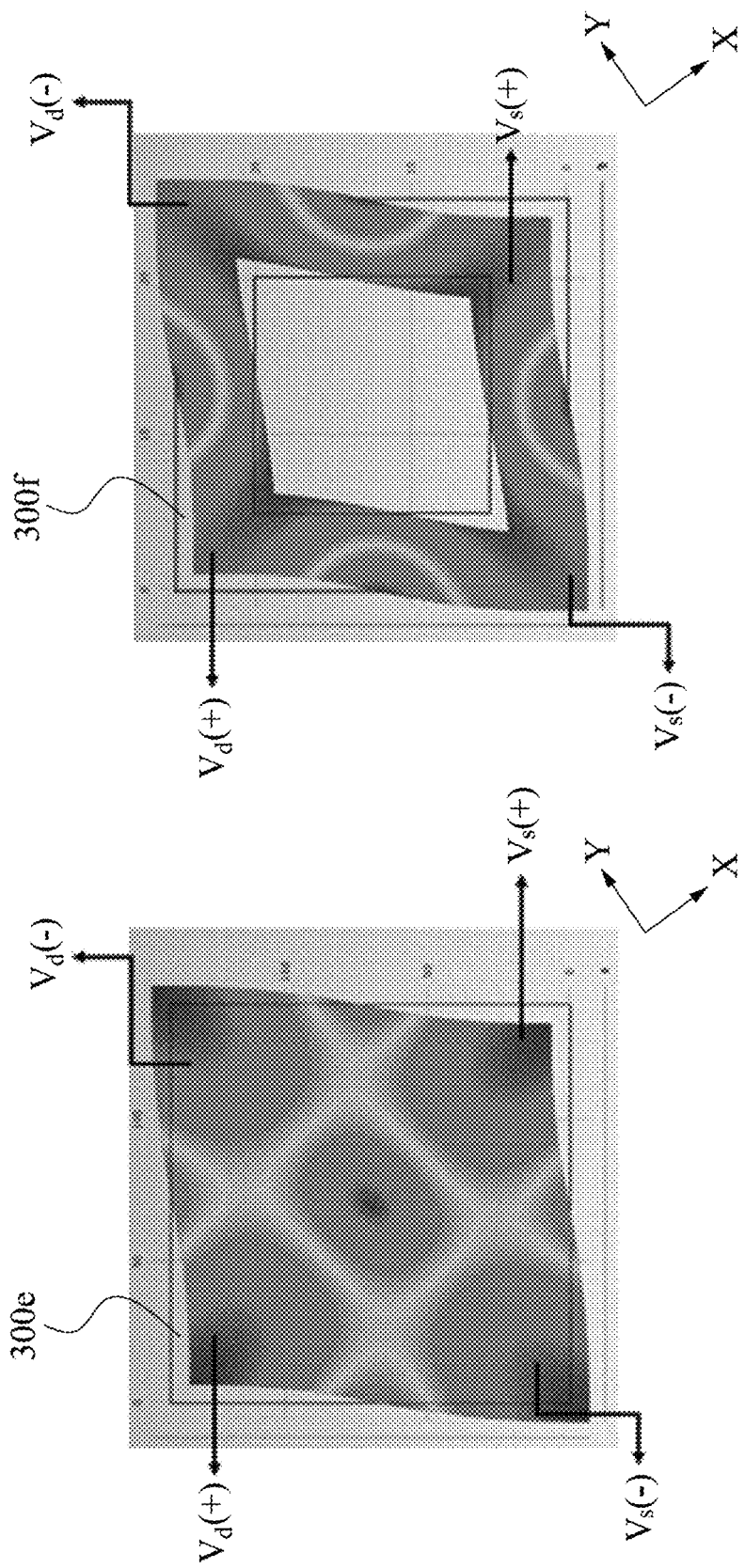
FIG. 13 shows a deforming result of a resonator body of a resonator according to a 6th embodiment of the present disclosure.
FIG. 14 shows a deforming result of a resonator body of a resonator according to a 7th embodiment of the present disclosure.

FIG. 13 shows a deforming result of a resonator body 300e of a resonator according to a 6th embodiment of the present disclosure. Please refer to FIG. 13, the structure of the resonator is similar to the structure of the resonator 100a of the 2nd embodiment, and the resonator body 300e is board-shaped. However, a difference between the resonator of the 6th embodiment and the resonator 100a of the 2nd embodiment is that the first direction X and the second direction Y in the 6th embodiment are parallel to two diagonals of the resonator body 300e, respectively. In other words, instead of disposed at four central points of four sides of the resonator body 300e, four transducer arms (not shown) are disposed at four corners of the resonator body 300e.

FIG. 14 shows a deforming result of a resonator body 300f of a resonator according to a 7th embodiment of the present disclosure. Please refer to FIG. 14, the structure of the resonator of the 7th embodiment is similar to the structure of the resonator of the 6th embodiment, but the resonator body 300f is a hollow board.

Figure 15B:
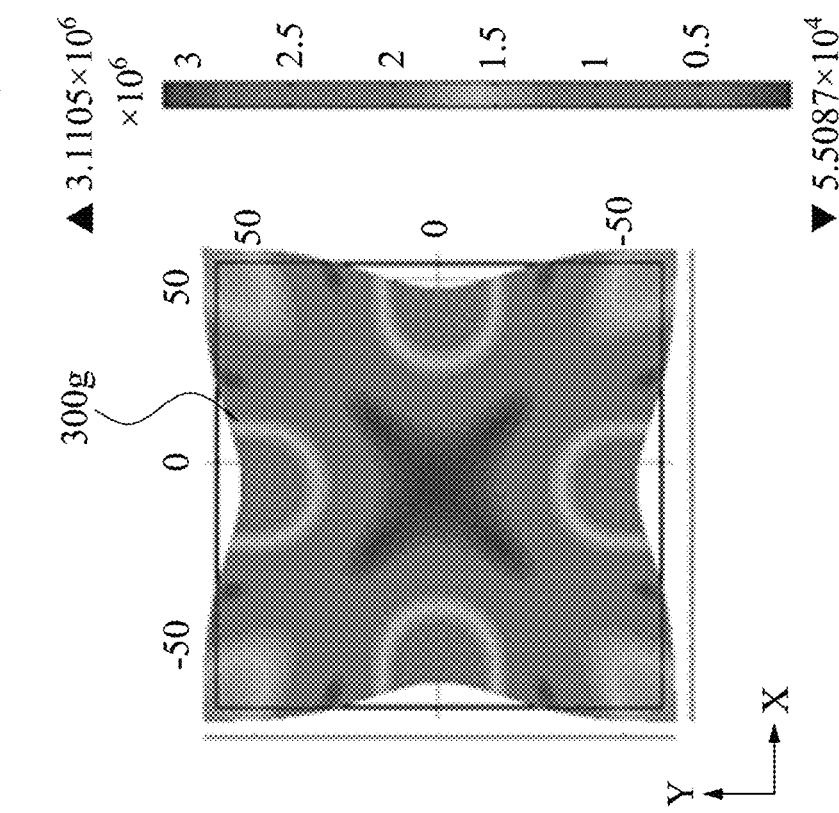
FIG. 15B shows another deforming result of the resonator body of the resonator according to the 8th embodiment of the present disclosure.
Figure 15A:
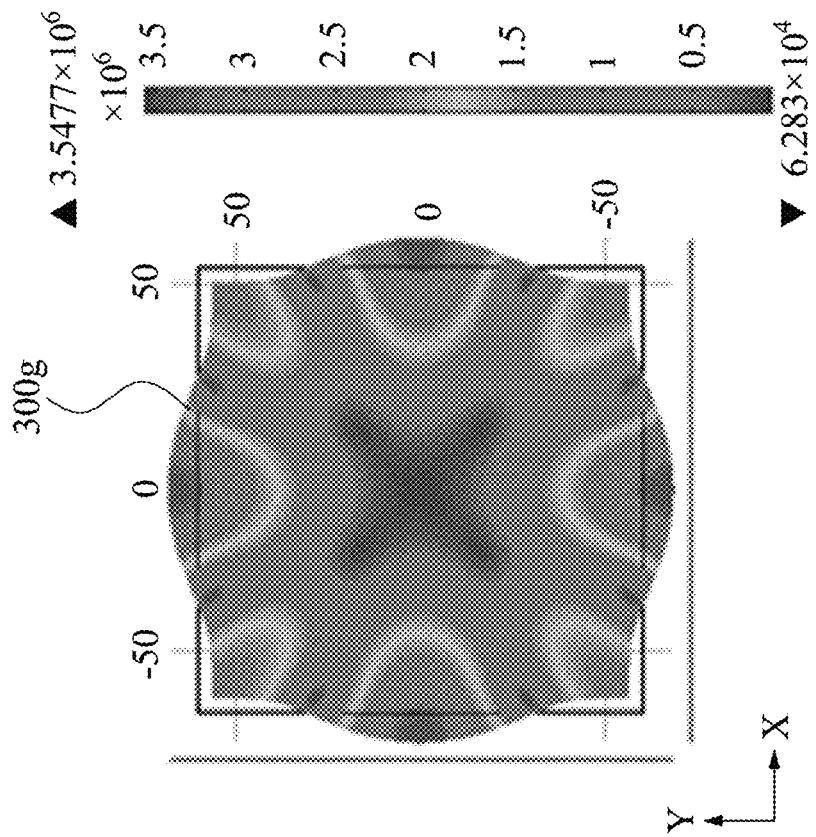
FIG. 15A shows one deforming result of a resonator body of a resonator according to an 8th embodiment of the present disclosure.

FIG. 15A shows one deforming result of a resonator body 300g of a resonator according to an 8th embodiment of the present disclosure. FIG. 15B shows another deforming result of the resonator body 300g of the resonator according to the 8th embodiment of the present disclosure. The structure of the resonator of the 8th embodiment is similar to the structure of the resonator 100b of the 2nd embodiment, but each of the first driving signal $V_d(+)$ and the second driving signal $V_d(-)$ is a high frequency signal. In the 8th embodiment, the resonator body 300g not only is deformed along the first direction X and the second direction Y, but also is deformed along a third direction and a fourth direction, e.g., two diagonal directions of the resonator body 300g; hence, at least one transducer arm is required, and the transducer arm can be connected to the resonator body 300g along the third direction or the fourth direction.

Figure 16B:
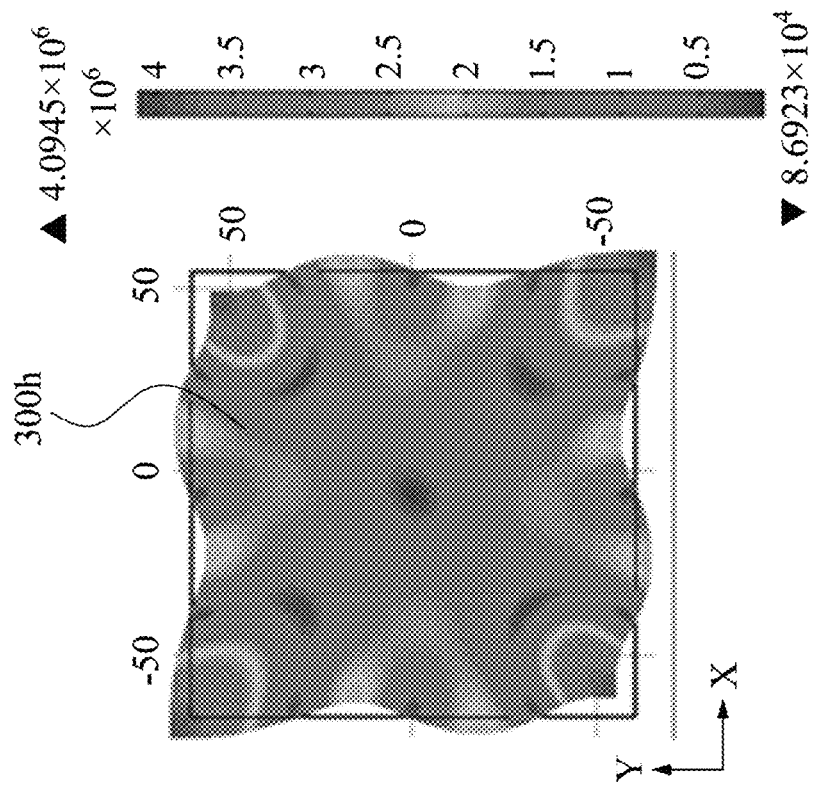
FIG. 16B shows another deforming result of the resonator body of a resonator according to the 9th embodiment of the present disclosure.
Figure 16A:
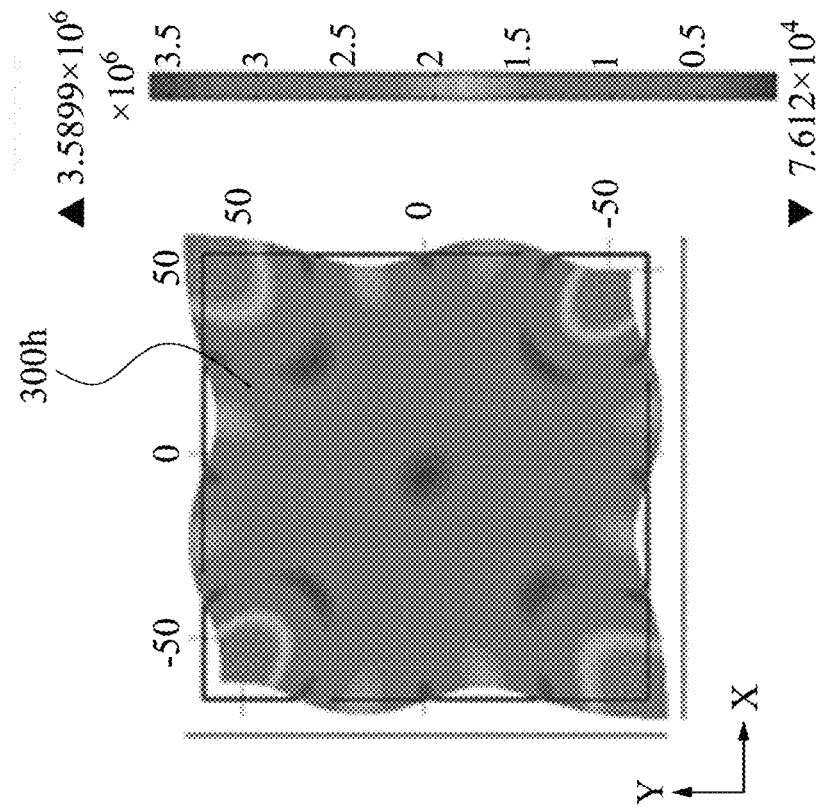
FIG. 16A shows one deforming result of a resonator body of a resonator according to a 9th embodiment of the present disclosure.

FIG. 16A shows one deforming result of a resonator body 300h of a resonator according to a 9th embodiment of the present disclosure. FIG. 16B shows another deforming result of the resonator body 300h of the resonator according to the 9th embodiment of the present disclosure. Please refer to FIGS. 16A and 16B, the structure of the resonator is similar to the structure of the resonator 100b of the 2nd embodiment, but the transducer arm is not connected to the central point of each sides, and each of the first driving signal $V_d(+)$ and the second driving signal $V_d(-)$ is a high frequency signal. In the 9th embodiment, at least one transducer arm is required, and the transducer arm can be connected to any of points which is not the nodal point.

Figure 17:
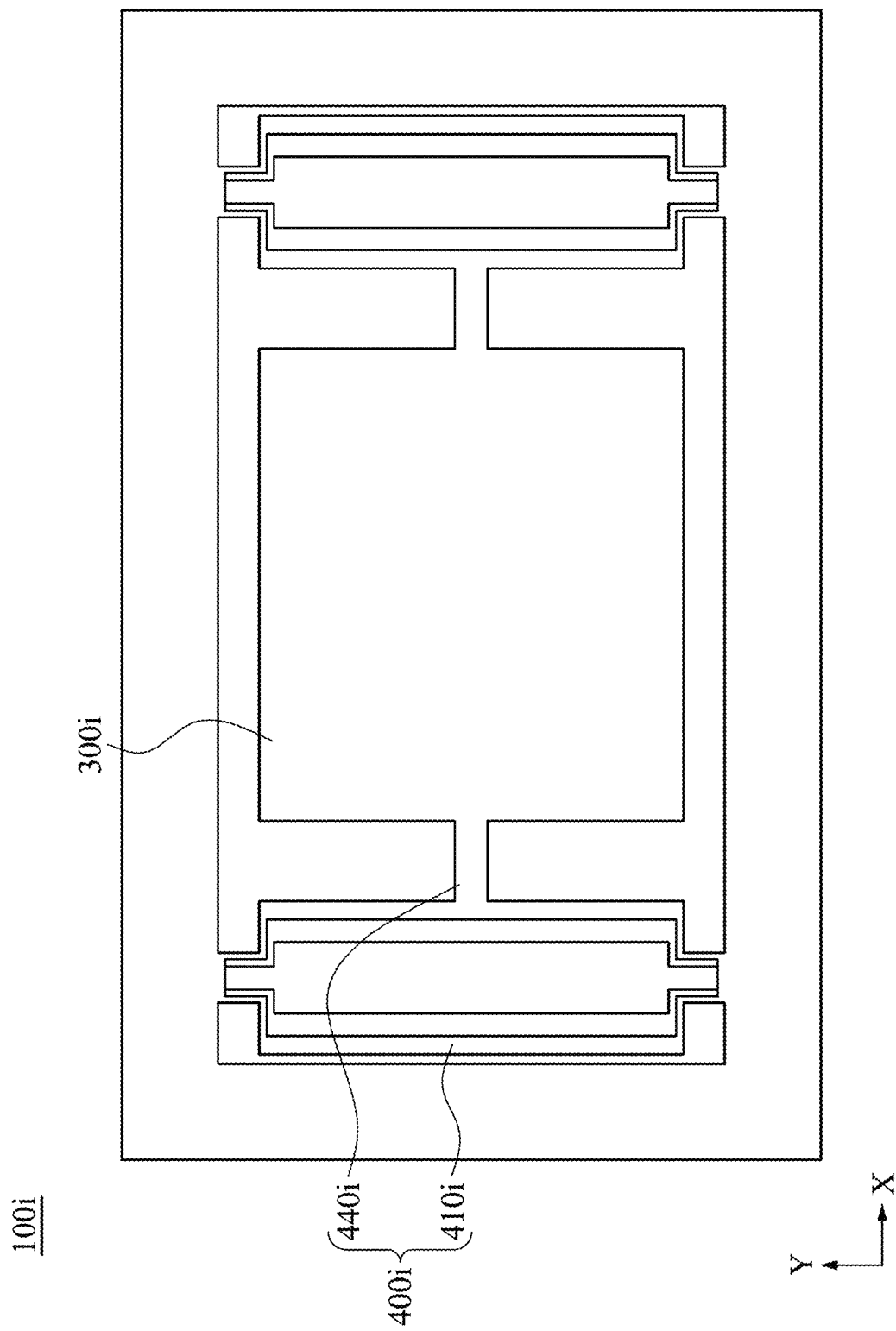
FIG. 17 shows a top view of a resonator according to a 10th embodiment of the present disclosure.

FIG. 17 shows a top view of a resonator 100*i* according to a 10th embodiment of the present disclosure. Please refer to FIG. 17, the resonator 100*i* includes two transducer arms connected to the resonator body 300*i* along the first direction X, and each of the transducer arms further includes a tether portion 440*i* connected between the first end (not labeled) of the base 410*i* and the resonator body 300*i*. The piezoelectric layer (not labeled) and the electrode layer (not labeled) are not extended to the tether portion 440*i*. In the 10th embodiment, the resonator body 300*i* is board-shaped. Each of the transducer arms is secured on the substrate (not labeled) via the anchor portion (not labeled), and each of the transducer arms 400*i* are a rectangle whose long side is parallel to the second direction Y. A length of tether portion 440*i* at the second direction Y is smaller than a length of the transducer arm at the second direction Y. The tether portion 440*i* can be made of single crystal silicon. In other embodiment, the transducer arm can be disc-shaped, a hollow disc or a hollow board, and the transducer arm is secured at the substrate via a nodal point of the base 410*i* or via an anchor portion which is disposed at the nodal points.

Figure 18:
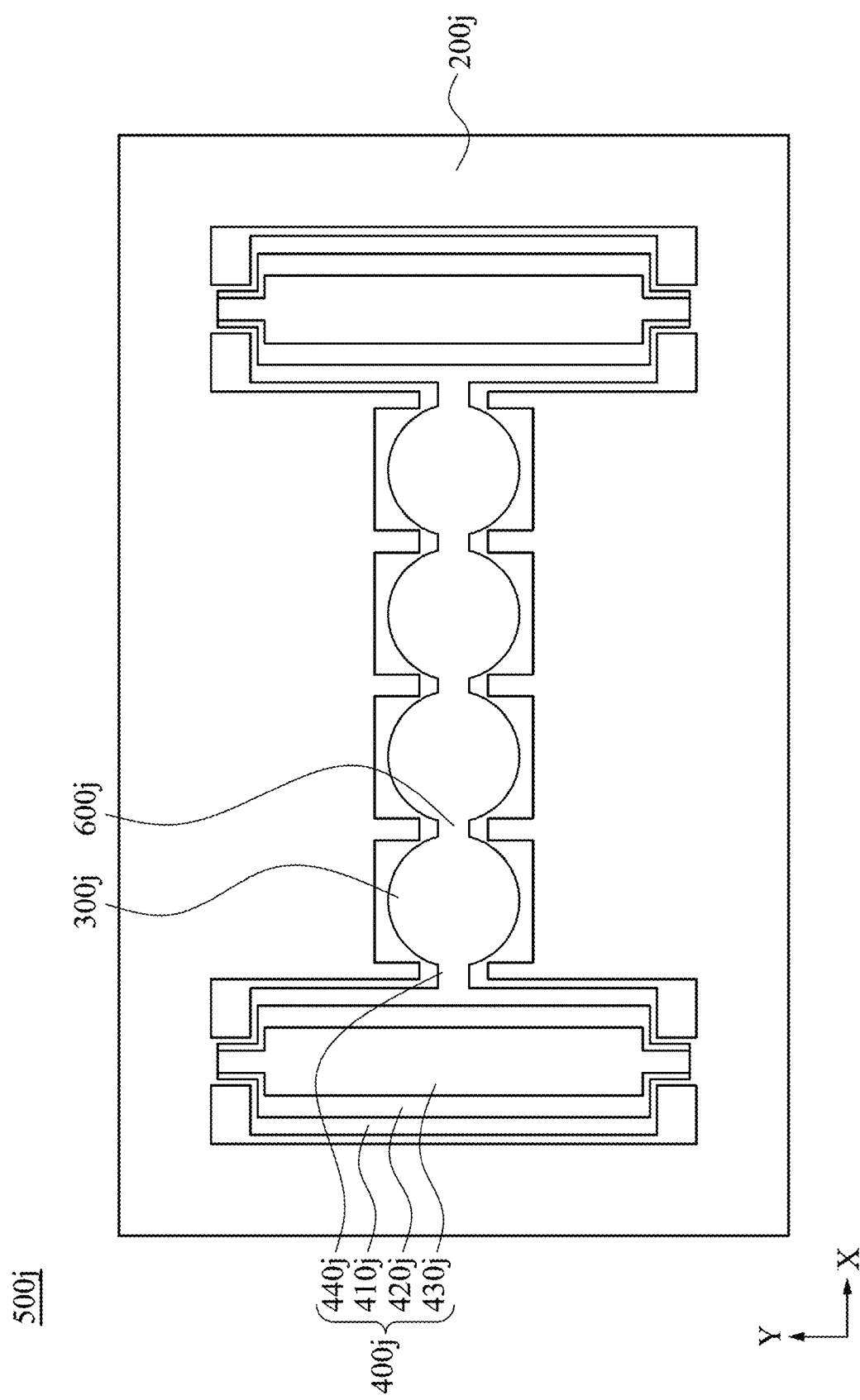
FIG. 18 shows a top view of a resonator array according to an 11th embodiment of the present disclosure.
Figure 19A:
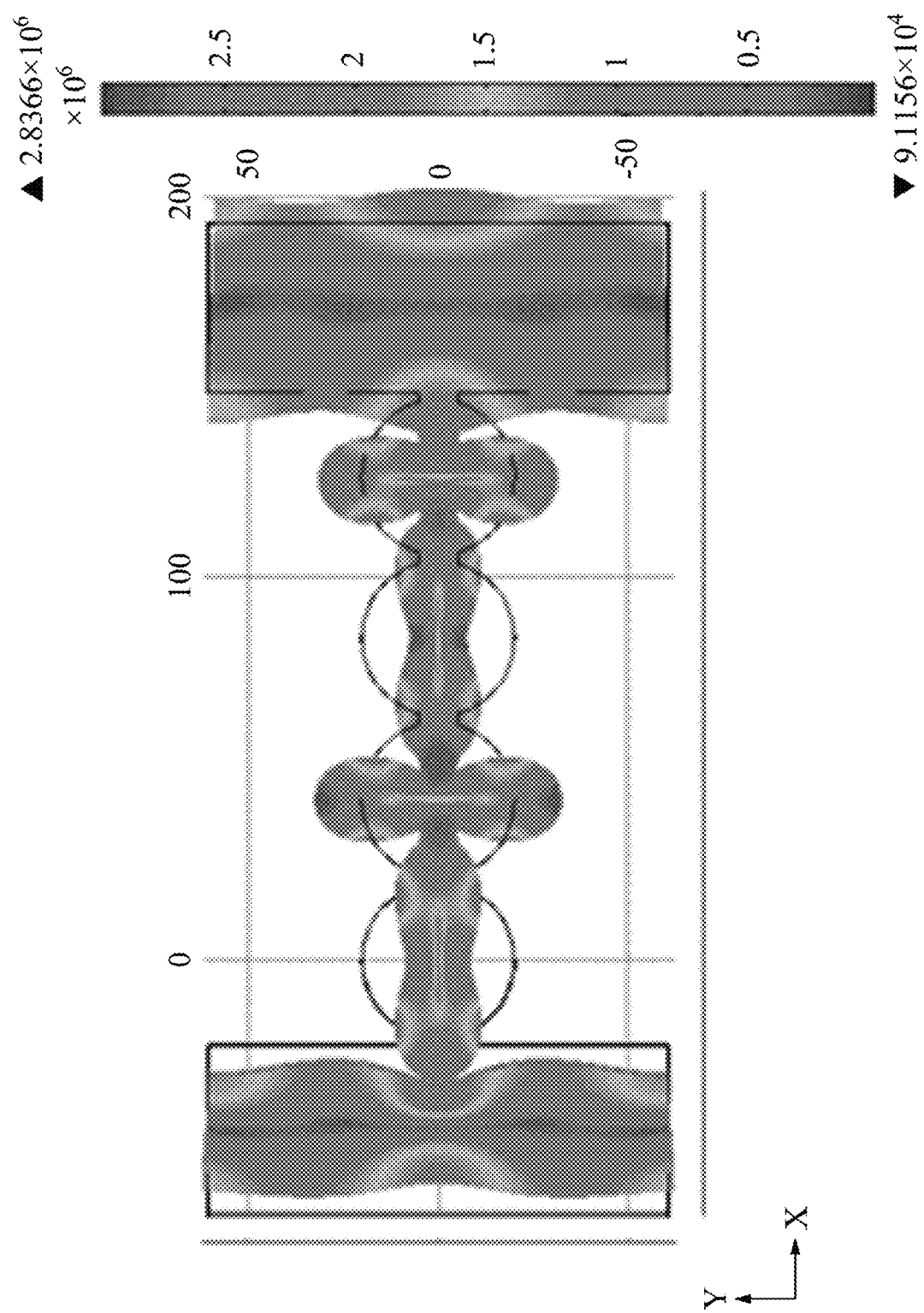
FIG. 19A shows one deforming result of the resonator array of FIG. 18.
Figure 19B:
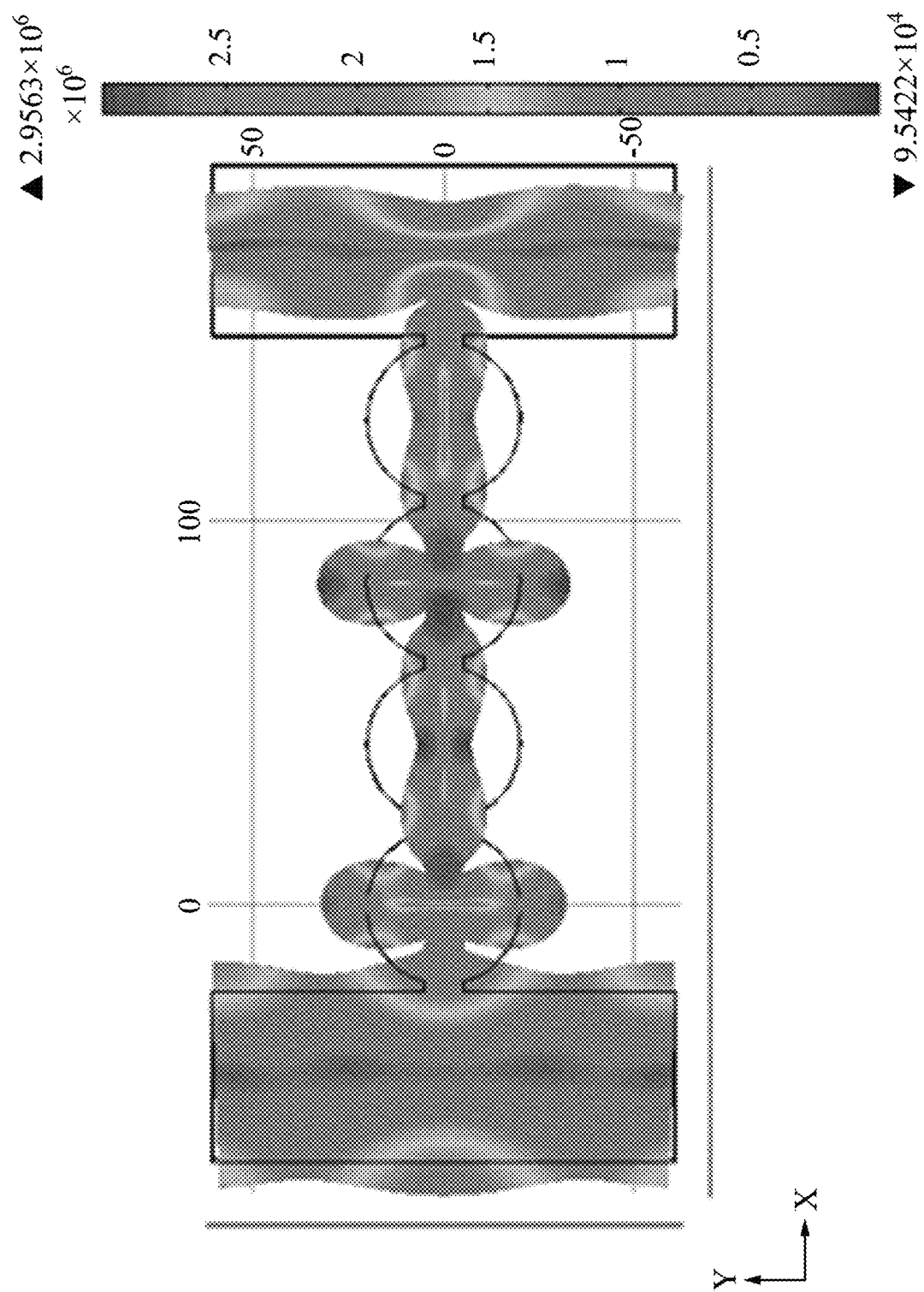
FIG. 19B shows another deforming result of the resonator array of FIG. 18.

FIG. 18 shows a top view of a resonator array 500*j* according to an 11th embodiment of the present disclosure. FIG. 19A shows one deforming result of the resonator array 500*j* of FIG. 18. FIG. 19B shows another deforming result of the resonator array 500*j* of FIG. 18. Please refer to FIGS. 18 to 19B, the resonator array 500*j* includes at least two resonator bodies 300*j*, at least one connecting arm 600*j*, at least one transducer arm 400*j* and a substrate 200*j*.

The resonator bodies 300*j* are deformed at least along a first direction X. The connecting arm 600*j* is connected between the two resonator bodies 300*j* along the first direction X. The transducer arm 400*j* is connected to one of the resonator bodies 300*j* along the first direction X and includes a base 410*j*, a piezoelectric layer 420*j* and an electrode layer 430*j*. The base 410*j* includes a first end (not labeled) connected to the resonator body 300*j*. The piezoelectric layer 420*j* is disposed above the base 410*j* but not extended to the resonator body 300*j*, and the electrode layer 430*j* is disposed above the piezoelectric layer 420*j* but not extended to the resonator body 300*j*. The substrate 200*j* is for securing the transducer arm 400*j* such that the two resonator bodies 300*j* are suspended.

Precisely, a number of the transducer arm 400*j* of the resonator array 500*j* of the 11th embodiment is two, and one of the transducer arms 400*j* is connected to one of the resonator bodies 300*j* along the first direction X, and the other one of the transducer arms 400*j* is connected to the other one of the resonator bodies 300*j* along the first direction X. In the 11th embodiment, a number of the resonator bodies 300*j* can be four, and a number of the connecting arm 600*j* is three. The three connecting arms 600*j* are connected between the four resonator bodies 300*j*, respectively.

In the 11th embodiment, the transducer arm 400*j* is secured at the substrate 200*j* via the anchor portion. Each of the transducer arms 400*j* further includes a tether portion 440*j*, and the tether portion 440*j* is connected between a first end (not labeled) of the base 410*j* and the resonator body 300*j*. The piezoelectric layer 420*j* and the electrode layer 430*j* are not extended to the tether portion 440*j*. In other embodiment (not shown), at least one transducer arm 400*j* is required, and a number of the resonator bodies 300*j* and a number of the connecting arm 600*j* are not limited thereto. Additionally, the shapes of the resonator bodies can be different, and the shapes of the transducer arms 400*j* can also be different.

Figure 20:
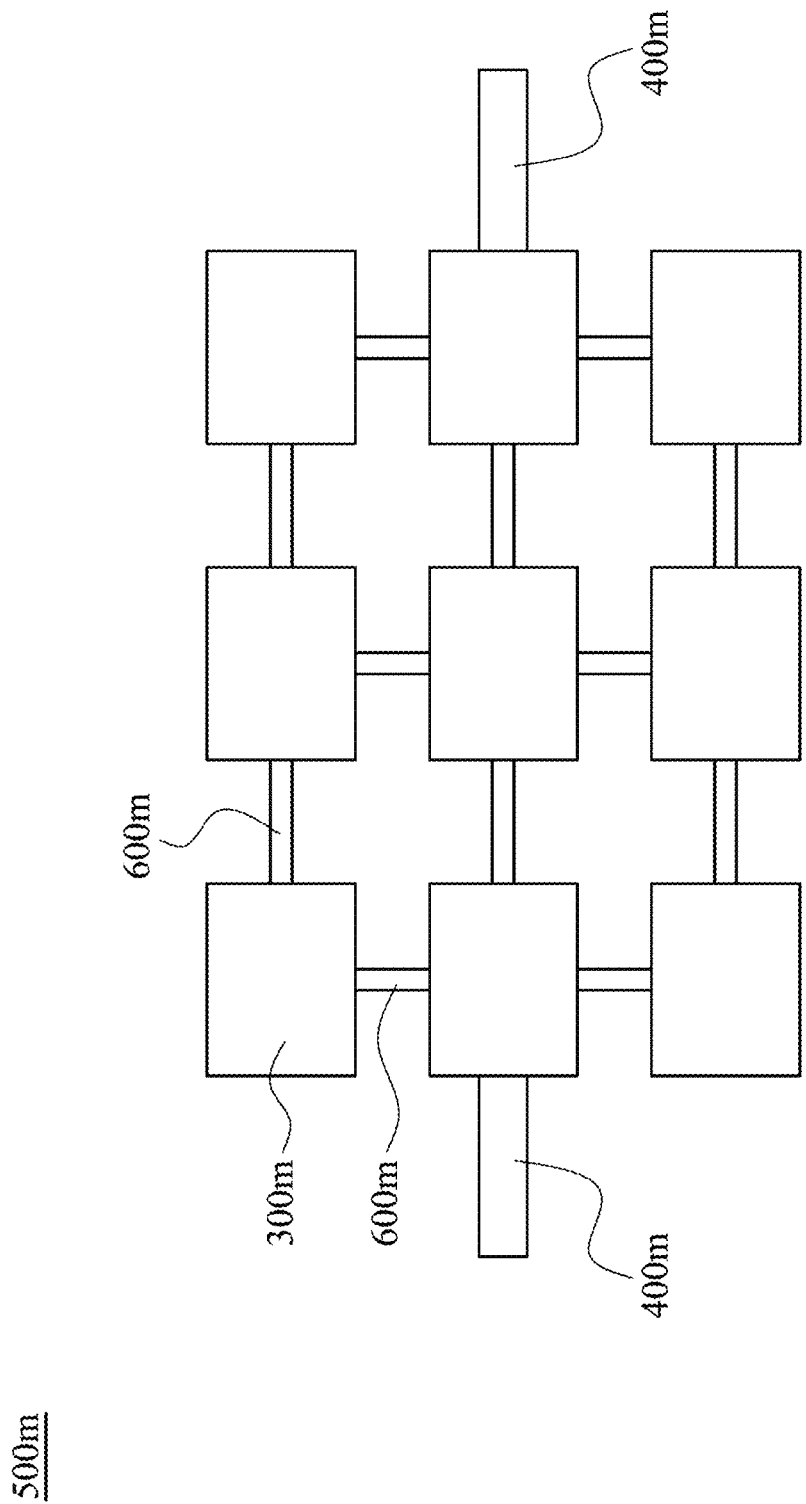
FIG. 20 shows a top view of a resonator array according to a 12th embodiment of the present disclosure.

FIG. 20 shows a top view of a resonator array 500*m* according to a 12th embodiment of the present disclosure. Please refer to FIG. 20, a number of the transducer arms 400*m* is two, and a number of the resonator bodies 300*m* are nine. Some of the connecting arms 600*m* are connected between two resonator bodies 300*m* along the first direction X, and the other connecting arms 600*m* are connected between two resonator bodies 300*m* along the second direction Y. The transducer arms 400*m* are secured at the substrate (not shown) via the anchor portions (not shown).

Please be noted that some details of the transducer arms 400*m* such as the piezoelectric layers, the electrode layers and the anchor portions in FIG. 20 are omitted for clarity. In addition, in FIGS. 1 to 20, the substrates and/or the transducers arm are omitted in some drawings, but the present disclosure is not limited thereto. Moreover, in FIGS. 1 to 20, $V_d(+)$, $V_d(-)$, $V_s(+)$ and $V_s(-)$ represent the first driving signals, the second driving signals, the first sensing signals and the second sensing signals, respectively, and the first direction X and the second direction Y represent two perpendicular directions which are not corresponding to any specific directions; hence, the first direction X and the second direction Y illustrated in each drawings may be different.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A resonator, which resonates in a bulk acoustic wave mode, comprising:
   a resonator body deformed at least along a first direction;
   at least one transducer arm connected to the resonator body along the first direction, the transducer arm comprising:
      a base comprising a first end, wherein the first end is connected to the resonator body;
      a piezoelectric layer disposed above the base but not extended to the resonator body; and
      an electrode layer disposed above the piezoelectric layer but not extended to the resonator body; and
   a substrate for securing the transducer arm such that the resonator body is suspended;
   wherein the resonator body is only connected to the at least one transducer arm, thereby being suspended from the substrate.

2. The resonator of claim 1, wherein the base further has a second end opposite to the first end, and the second end is secured at the substrate.

3. The resonator of claim 1, wherein the transducer arm further comprises:
   at least one anchor portion protruded from one side of the base, wherein a distal end of the anchor portion is secured at the substrate.

4. The resonator of claim 1, wherein the base is configured for electrically connecting to a power ground.

5. The resonator of claim 1, wherein the resonator body is deformed along a second direction perpendicular to the first direction, a number of the transducer arm is four, two of the transducer arms are connected to the resonator body along the first direction, and the other two of the transducer arms are connected to the resonator body along the second direction.

6. The resonator of claim 5, wherein a first driving signal and a second driving signal are given to the electrode layers of two of the transducer arms, respectively, and a first sensing signal and a second sensing signal are output from the electrode layers of the other two of the transducer arms, respectively.

7. The resonator of claim 1, wherein the transducer arm further comprises:
   a tether portion connected between the first end and the resonator body;
   wherein the piezoelectric layer and the electrode layer are not extended to the tether portion.

8. The resonator of claim 1, wherein the resonator is disc-shaped or board-shaped.

9. A resonator array, which resonates in a bulk acoustic wave mode, comprising:
   at least two resonator bodies deformed at least along a first direction;
   at least one connecting arm connected between the two resonator bodies along the first direction;
   at least one transducer arm connected to one of the resonator bodies along the first direction and being opposite to the connecting arm, the transducer arm comprising:
      a base comprising a first end, wherein the first end is connected to one of the resonator bodies;
      a piezoelectric layer disposed above the base but not extended to one of the resonator bodies; and
      an electrode layer disposed above the piezoelectric layer but not extended to one of the resonator bodies; and
   a substrate for securing the transducer arm such that the two resonator bodies are suspended.

10. The resonator array of claim 9, wherein a number of the transducer arm is two, one of the transducer arms is connected to one of the resonator bodies along the first direction, and the other one of the transducer arms is connected to the other one of the resonator bodies along the first direction.

11. The resonator array of claim 9, wherein a number of the resonator bodies is four, a number of the connecting arm is three, and the three connecting arms are connected between the four resonator bodies along the first direction, respectively.

* * * * *